United States Patent [19]

Kita et al.

[11] Patent Number: 5,231,289
[45] Date of Patent: Jul. 27, 1993

[54] THERMAL PHOTODETECTOR AND METHOD OF MANUFACTURING THE SAME

[75] Inventors: Jun-ichi Kita; Hiroyuki Kishihara, both of Kyoto, Japan

[73] Assignee: Shimadzu Corporation, Kyoto, Japan

[21] Appl. No.: 871,771

[22] Filed: Apr. 21, 1992

[30] Foreign Application Priority Data

Apr. 22, 1991 [JP] Japan .................................. 3-90416

[51] Int. Cl.[5] .......................... G01N 21/45; G01J 5/06
[52] U.S. Cl. .............................. 250/338.1; 250/338.3; 250/352
[58] Field of Search ............... 250/338.1, 338.2, 338.3, 250/352, 370.15, 338.4

[56] References Cited

U.S. PATENT DOCUMENTS

| | | | |
|---|---|---|---|
| 4,147,562 | 4/1979 | Chiang et al. | 250/338.3 X |
| 4,463,262 | 7/1984 | Contreras | 250/352 X |
| 4,480,979 | 11/1989 | Yoshida | 250/338.4 |
| 4,982,093 | 1/1991 | Voles | 250/338.3 X |
| 5,041,723 | 8/1991 | Ishida et al. | 250/339 |
| 5,081,358 | 1/1992 | Yoshikawa | 250/338.3 |

FOREIGN PATENT DOCUMENTS

| | | | |
|---|---|---|---|
| 56-133634 | 10/1981 | Japan | 250/338.3 |
| 60-171425 | 9/1985 | Japan | 250/338.3 |
| 61-193030 | 8/1986 | Japan | 250/338.3 |
| 1-3525 | 1/1989 | Japan | 250/338.3 |

Primary Examiner—Constantine Hannaher
Assistant Examiner—Edward J. Glick
Attorney, Agent, or Firm—Nikaido, Marmelstein, Murray & Oram

[57] ABSTRACT

A thermal photodetector includes a thermal photodetector element and a support stand for supporting the thermal photodetector element. The support stand is made of a material of which heat conduction is relatively small, and is thermally connected to and mounted on a mount of which temperature is controlled to a predetermined temperature. The sizes of the support stand are determined such that the quantity of heat conduction in a heat conduction passage from the thermal photodetector element to the mount is equal to a predetermined quantity. The method of manufacturing this thermal detector includes the steps of exposing, to light, a photosensitive glass plate having a thickness corresponding to the height of a support stand of a thermal photodetector to be manufactured. The light exposure is made with the use of a mask having a shape which corresponds to the shape in transverse section of the support stand. The photosensitive glass plate is adhered to pyroelectric crystal plate provided on one surface thereof with an electrode. The surface of the pyroelectric crystal plate on which the electrode is mounted faces the photosensitive glass plate. The surface of the pyroelectric crystal plate opposite to the adhered surface is polished. The light-sensed portion of the photosensitive glass plate is then removed.

8 Claims, 6 Drawing Sheets

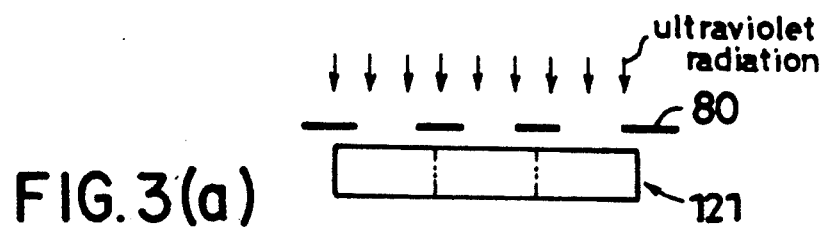
FIG. 3(a)
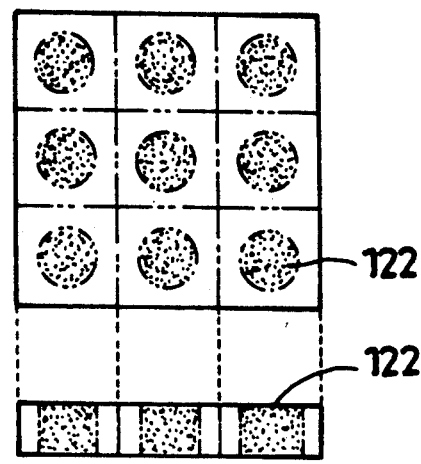
FIG. 3(b)
FIG. 3(c)
FIG. 3(d)
FIG. 3(e)
FIG. 3(f)
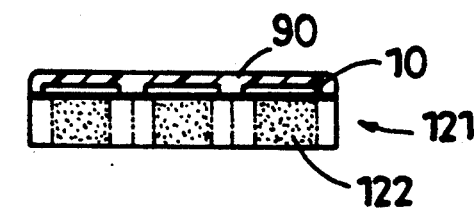
FIG. 3(g)
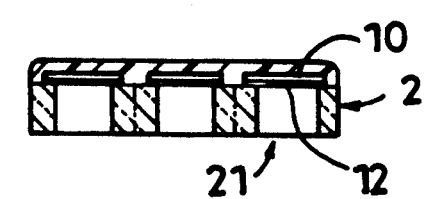

PRIOR ART　　PRIOR ART

THERMAL PHOTODETECTOR AND METHOD OF MANUFACTURING THE SAME

BACKGROUND OF THE INVENTION

The present invention relates to a thermal photodetector such as a highly sensitive infrared detector or the like to be used in a Fourier transform infrared spectroscopy (FT-IR) or the like.

As the highly sensitive infrared detector of the room-temperature operating type for FT-IR, a pyroelectric infrared detector is used. Particularly, there is widely used a pyroelectric infrared detector using a pyroelectric crystal of the TGS (triglycine-sulphate) system such as D-TGS, LA-TGS, DLA-TGS or the like which presents a great pyroelectric coefficient.

A pyroelectric element is used in a highly sensitive infrared detector because of the following reasons. In a quantum-type infrared detector element using a semi-conductor or the like, the band gap is small so that the influence of a dark current is great. Accordingly, no good sensitivity can be obtained unless such an element is cooled by liquid nitrogen. Further, the wavelength range which can be detected by such a highly sensitive element is limited to a wavelength range shorter than 14 $\mu$m.

In TGS-system crystals, the Curie temperature Tc is about 60° C. even for DLA-TGS of which Curie temperature is the highest in the TGS-system crystals. In such a crystal, the temperature range in which the sensitivity is stabilized is as narrow as 24° to 36° C. It is therefore inevitably required to control the temperature of a pyroelectric crystal. A pyroelectric infrared detector is included in a thermal photodetector adapted to detect fine temperature change due to the incidence of infrared radiation (heat wave) upon the pyroelectric crystal. Accordingly, if the pyroelectric crystal is cooled in the same manner as done for a quantum detector element, this produces an adverse effect such as decrease in sensitivity, mixing of noise or the like.

More specifically, in a quantum-type detector element, there is adopted a cooling method for only the purpose of efficiently liberating the heat quantity of the element in order to maintain the element temperature to a predetermined temperature or less. However, when such a cooling method is merely applied to a pyroelectric detector element adapted to detect a heat energy itself, the detector element is lowered in responsivity. In the worst case, there are instances where the detector element cannot detect a heat energy any more due to noise caused by temperature control circuit.

In this connection, provision is conventionally made as set forth below. Although the performance of FT-IR apparatus is lowered in its entirety, the optical system of the FT-IR is stopped down so that the crystal temperature does not exceed 36° C. even at the time when the amount of light incident upon a pyroelectric detector is maximized. Alternatively, the pyroelectric detector is indirectly adjusted in temperature from a slightly remote place.

FIG. 5 (a) to (b) show a conventional example of such a temperature adjusting structure. In this structure, a temperature adjusting medium 52 is sticked to the periphery of a lateral wall of an enclosing body 511 which encloses a pyroelectric detector 51, and a Peltier element 53 serving as temperature adjusting means is disposed at the other end of the adjusting medium 52.

Accordingly, the temperature of the pyroelectric crystal of the pyroelectric detector 51 is indirectly adjusted.

However, highly precise and stable temperature control cannot be always assured by the arrangement shown in FIG. 5 (a) to (b) for the following reasons. That is, a plurality of detector assemblies each having the temperature adjusting structure shown in FIG. 5 (a) to (b), differ from one another in the thermal-conductivity and thermal time constant between the detectors and the detector enclosing bodies 511. Further, the thermal contact areas between the pyroelectric detector 51 and the medium 52 and between the Peltier element 53 and the medium 52 are great. Accordingly, a plurality of detector assemblies differ from one another in thermal contacts (thermal resistances) between the pyroelectric detectors 51 and the media 52 and between the Peltier elements 53 and the media 52. Thus, the respective detector assemblies are poor in reproducibility.

On the other hand, the following examples are conventionally proposed of a structure arranged with the improvement in sensitivity of a pyroelectric detector taken into consideration (a structure in which heat escape from a pyroelectric element is minimized). As shown in FIG. 6 (a), a support base plate 62 of a pyroelectric element 610 has an opening 621 formed by etching, so that the underside of a light receiving portion (where electrodes 611 are formed) is hollow to prevent thermal diffusion. As shown in FIG. 6 (b), a pyroelectric element 710 is placed on a frame 72 having four legs to prevent thermal diffusion.

When such a structure is applied to a pyroelectric detector element using a TGS-system crystal, the element temperature cannot be controlled in a predetermined range so that the element cannot be operated in a normal manner. To operate a pyroelectric detector element using a TGS-system crystal with good sensitivity, it is required to thermally connect the element to the temperature adjusting medium in a suitable amount. In this connection, such a thermal connecting medium should have a highly precise structure with good reproducibility.

According to the structure shown in FIG. 6 (a), the base plate 62 is made of MgO or the like and the opening 621 is formed by etching the base plate 62 with phosphorus. However, the opening thus formed by etching is poor in dimensional precision.

To make the structure shown in FIG. 6 (b), there is required a step of placing a minute pyroelectric element (having sizes of about 3 mm$^2$ and a thickness of about 10 $\mu$m) 710 on the frame 72 having four legs. It is not easy to automatically carry out such a step without the element damaged. Thus, the structure shown in FIG. 6 (b) is not fit for mass-production.

BRIEF DESCRIPTION OF THE DRAWINGS

FIG. 3 (a) to (g) illustrate the steps of a manufacturing method in accordance with an embodiment of the present invention;

SUMMARY OF THE INVENTION

Figure 1A:
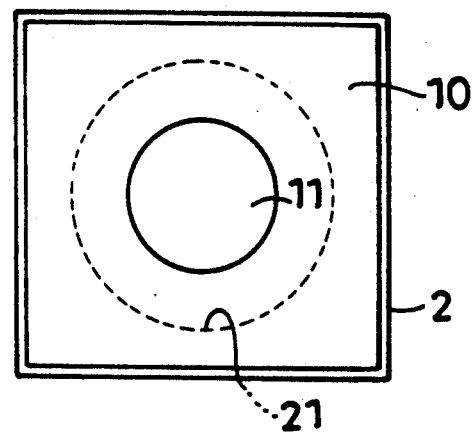
FIG. 1 (a) to (b) show the structure of main portions of a thermal photodetector in accordance with an embodiment of the present invention, in which (a) and (b) are respectively plan and vertical section views.

It is an object of the present invention to provide a thermal photodetector capable of controlling, with high precision, the temperature of a thermal photodetector element such as a pyroelectric element in a predetermined range.

To achieve the object above-mentioned, the thermal photodetector of the present invention comprises a thermal photodetector element and a support stand for supporting the thermal photodetector element, the support stand being thermally connected to and mounted on a mount of which temperature is controlled to a predetermined temperature. The support stand for connecting the element to the temperature-controlled mount is so arranged as to precisely limit the quantity of heat conduction from the element to the mount to a predetermined level. That is, the sizes of the support stand are so precisely determined as to achieve such limitation of the quantity of heat conduction.

In the detector in accordance with the present invention, the temperature of the mount is controlled to the lowest temperature in a temperature range in which the responsivity of the thermal photodetector element is stabilized. Further, the respective sizes of the support stand are determined such that the quantity of heat conduction in a heat conduction passage formed by the support stand is equal to such a quantity of heat conduction as to limit the temperature of the thermal photodetector element to the highest temperature in a temperature range in which the responsivity of the element is stabilized, at the time when a maximum amount of light in a range to be detected is constantly incident upon the light receiving portion of the thermal photodetector element. This enables the thermal photodetector element to be operated in a temperature range in which the responsivity of the element is stabilized.

When provision is made such that the quantity of heat conduction in the heat conduction passage formed by the support stand becomes greater, the element temperature can be controlled in a narrower range of temperature. However, this is not preferred for the following reason. In a thermal photodetector element including a pyroelectric-type detector element adapted to detect the variations of incident light and subsequent variations of the element temperature, the responsivity of the element is lowered with the increase in quantity of heat conduction.

The manufacturing method in accordance with the present invention is a method of manufacturing the thermal photodetector having the arrangement above-mentioned, and comprises the steps of: exposing, to light, a photosensitive glass plate having a thickness corresponding to the height of the support stand of a thermal photodetector to be manufactured, the light exposure being made with the use of a mask having a light shield portion of which shape is corresponding to the shape in transverse section of the support stand; sticking, with adhesives, the photosensitive glass plate to a pyroelectric crystal plate provided on one surface thereof with an electrode for taking out a signal, that surface of the pyroelectric crystal plate on which the electrode is mounted, facing the photosensitive glass plate; polishing the surface of the pyroelectric crystal plate opposite to the sticked surface thereof, thereby to reduce the thickness of the pyroelectric crystal plate; and removing, by etching, the light-sensed portion of the photosensitive glass plate which has been formed by the light exposure.

In the manufacturing method above-mentioned, there is used, as the material of the support stand, a photosensitive glass plate of which a light-sensed portion can be removed by etching with high precision. Thus, a highly precise support stand can be produced with good reproducibility. Further, since the support stand can be formed by etching, the detector of the present invention can be mass-produced.

To use a pyroelectric crystal body as a highly sensitive photodetector element, it is required that the thickness of the pyroelectric crystal body is about 10 μm. According to the method of the present invention, a pyroelectric crystal as sticked to the glass plate having no hole, is polished, after which a hole is formed without the crystal damaged. Thus, the thickness adjusting step is simplified.

DETAILED DESCRIPTION OF THE INVENTION

The following description will discuss the present invention with reference to the attached drawings illustrating preferred embodiments thereof.

Figure 2A:
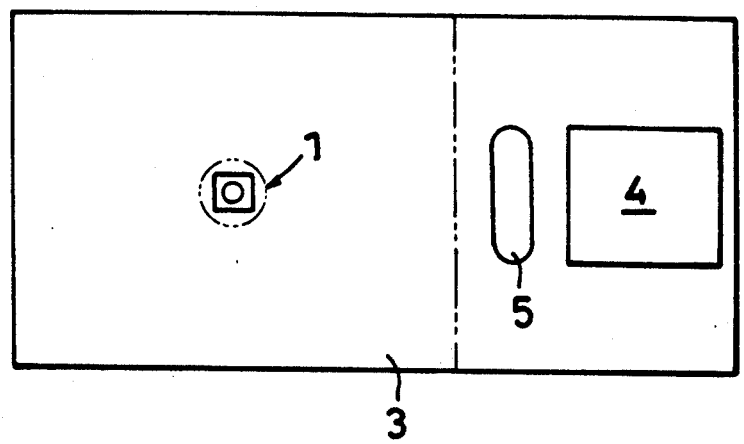
FIG. 2 (a) to (b) shows the general arrangement of the thermal photodetector shown in FIG. 1, in which (a) and (b) are respectively plan and side views.
Figure 2B:
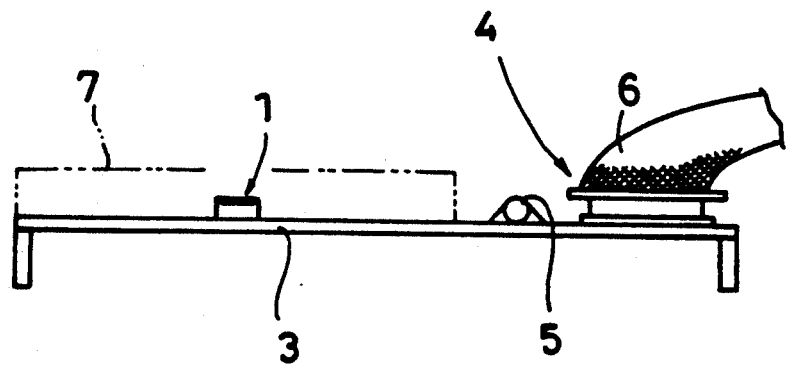
Figure 4A:
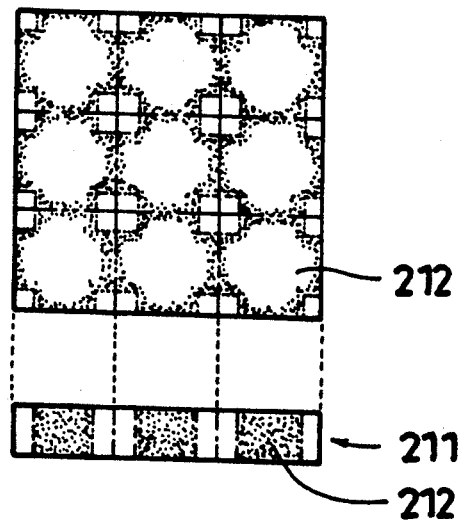
FIG. 4 (a) to (d) illustrate the steps of a manufacturing method in accordance with another embodiment of the present invention.
Figure 4B:
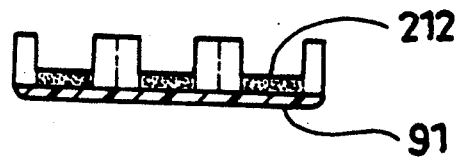
Figure 4C:
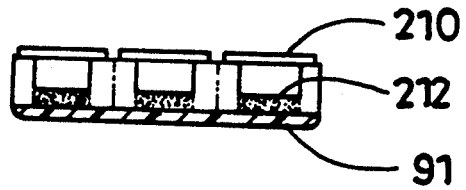
Figure 4D:
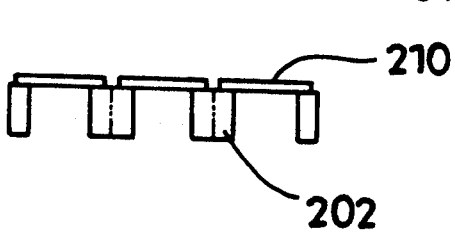
Figure 5A:
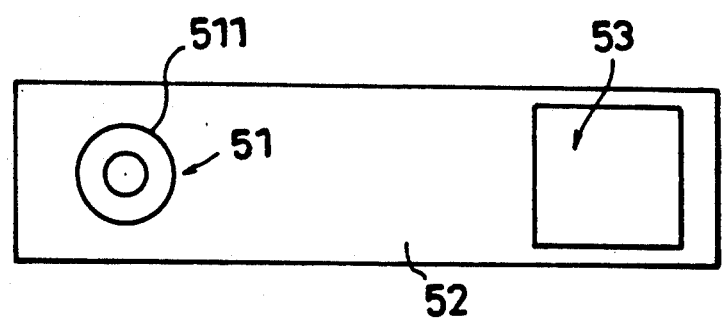
FIG. 5 (a) to (b) are views of a conventional example of a temperature adjusting structure for a pyroelectric detector.
Figure 5B:
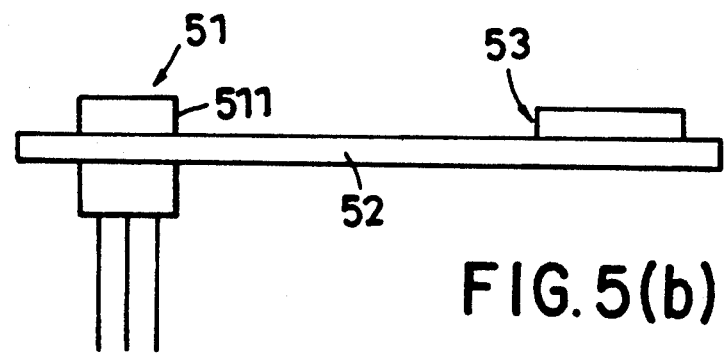

As shown in FIG. 2 (a) and (b), a pyroelectric element 1 is mounted on a hybrid IC board (hereinafter referred to as HIC board) 3 at a predetermined position thereof. A Peltier element 4 is sticked to one end of the HIC board 3, and a temperature detector element 5 is disposed between the Peltier element 4 and the pyroelectric element 1. As the temperature detector element 5, there is used an element which can be closely sticked to the HIC board 3 and which can accurately detect the temperature of the HIC board 3 (for example, "AD590" manufactured by ANALOG DEVICES incorporated).

The Peltier element 4 is thermally connected, at the heat dissipation side thereof, to a place having a great heat capacity through a net-like body of copper 6. Thus, the temperature of the HIC board 3 can be accurately controlled to, for example, 24° C. by the Peltier element 4 and the temperature detector element 5. A preamplifier circuit (not shown) is mounted on the HIC board 3 around its portion on which the pyroelectric element 1 is mounted. The preamplifier circuit is adapted to process an output signal from the pyroelectric element 1. A light- and noise-shielding cover 7 is also disposed.

Figure 1B:
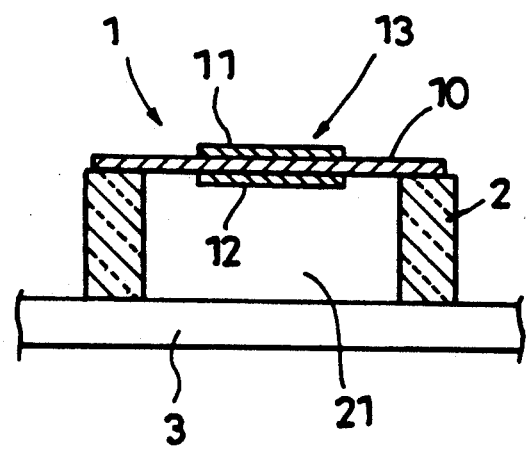

As shown in FIG. 1 (a) and (b), the pyroelectric element 1 is arranged such that circular electrodes 11, 12 are formed on a pyroelectric crystal body (DLA-TGS) 10 at vertically opposite positions of the center part thereof and serve as a light receiving portion 13. The pyroelectric element 1 is held by a support stand 2 made of photosensitive glass, and thermally connected to the HIC board 3 through the support stand 2.

The support stand 2 is provided in the center part thereof with a cylindrical opening 21, thereby to restrain thermal diffusion at the light receiving portion 13 of the pyroelectric element 1. With the thermal conductivities of the photosensitive glass and the pyroelectric element taken into consideration, the configurations and sizes of the respective members above-mentioned are determined such that the quantity of heat conduction in the heat conduction passage from the pyroelectric element 1 to the HIC board 3 formed by the support stand 2 is equal to such a quantity as to limit the highest temperature of the element to 36° C. when a maximum amount of light is constantly incident upon the light receiving portion 13 of the pyroelectric element 1.

In the arrangement above-mentioned, attention should be placed on the following point. When no light is incident upon the pyroelectric element 1, the element temperature is maintained at the controlled temperature of the HIC board 3, i.e., 24° C., and when a maximum amount of light is constantly incident upon the pyroelectric element 1, the element temperature is maintained at 36° C. In other words, the element temperature varies in a range from 24° to 36° C. with the amount of incident light. More specifically, the temperature of the pyroelectric element 1 can be always accurately adjusted in such a range that the responsivity of the pyroelectric crystal body (DLA-TGS) is stabilized.

In the arrangement above-mentioned, the area of the sensitive portion of the pyroelectric element is determined by the electrode area, which can be precisely determined by a vapor deposition method using a metal mask. When photosensitive glass is used, the support stand can be prepared with high precision as to the height thereof, the size of the hole therein, and the distance between the hole and the sensitive portion of the pyroelectric element. The thermal connection between the sensitive portion and the HIC board is good in reproducibility. Further, the sizes of the HIC board 3 are greater than those of the pyroelectric element 1, so that the HIC board 3 can be accurately adjusted in temperature. This is also a point which is worthy of attention.

In the arrangement above-mentioned, the HIC board 3 is greater than the pyroelectric element 1, but the board itself does not have a great heat capacity. Accordingly, the control of the board temperature by the Peltier element 4 can be stably made with a low electric power. Further, since the pyroelectric element 1, the preamplifier circuit, the temperature adjusting circuit and the like are mounted on the HIC board 3, the entire detector can be arranged in a module. Further, the module can be advantageously arranged in a compact design.

In the embodiment above-mentioned, the pyroelectric element 1 is thermally connected, through the support stand 2, to the HIC board 3 of which temperature is controlled. Alternatively, the pyroelectric element 1 may be thermally connected, through the support stand 2 made of a suitable heat conductive material, to a heat sink of which temperature is controlled by heating and cooling means. As the material of the support stand 2, there may be suitably used, instead of photosensitive glass, a substance such as general glass, resin including plastics or the like which is relatively low in heat conduction and which can be machined with high precision.

The following description will discuss a method of manufacturing the detector having the arrangement above-mentioned with reference to FIG. 3 (a) to (g).

As shown in FIG. 3 (a), a photosensitive glass plate 121 is exposed to ultraviolet radiation with the use of a mask 80. Then, as shown in FIG. 3 (b), there are formed light-sensed portions 122, which will be later removed to form holes with high precision (The heat conduction varies with the sizes of the holes).

As shown in FIG. 3 (c), a pyroelectric crystal body 110 is provided on one surface thereof with electrodes 12 for taking out signals. As shown in FIG. 3 (d), that surface of the pyroelectric crystal body 110 on which the electrodes 12 are formed, is sticked, with the use of adhesives, to the photosensitive glass plate 121 which has been exposed to light. At this step, the adhesives are previously uniformly applied to those entire surfaces of the photosensitive glass plate 121 and/or the pyroelectric crystal body 110 which are to be sticked to each other.

After the adhesives have been solidified, the top surface of the pyroelectric crystal body 110 is polished such that the pyroelectric crystal body 110 has a thickness of about 10 μm as shown in FIG. 3 (e). Then, the pyroelectric crystal body 110 is divided into pieces to form pyroelectric crystal bodies 110 having configurations as shown in FIG. 3 (f). Then, the photosensitive glass plate 121 is covered at the top surfaces thereof with wax 90, thereby to protect the pyroelectric crystal bodies 10.

The light-sensed portions 122 are etched with the use of 5%-hydrogen fluoride (HF). In the etching, the adhesives between the photosensitive glass plate 121 and the pyroelectric crystal body 110 serve as a stopper. Thus, there are formed support stands 2 having cylindrical hollow portions 21 below the electrodes 12 as shown in FIG. (g).

Then, the wax 90 is removed, and electrodes are formed on those positions of the top surfaces of the pyroelectric crystal bodies 10 which are opposite to the electrodes 12. The support stands 2 are separated from one another, thus preparing pyroelectric elements 1, each of which has the arrangement shown in FIG. 1.

In the manufacturing method above-mentioned, particular attention should be placed on the following points. As the material of the support stands 2, there is used photosensitive glass of which light-sensed portions can be etched with high precision. It is therefore possible to manufacture highly precise support stands with good reproducibility. Further, since the support stands can be made by etching, the detectors can be mass-produced.

To use a pyroelectric crystal body as a highly sensitive photodetector element, it is required that the thickness of the pyroelectric crystal body is under 10 μm. According to the manufacturing method of the present invention, such a thickness is obtained by polishing a pyroelectric crystal plate as sticked to a rigid glass plate. Thus, the thickness forming step is advantageously simplified.

In photosensitive glass, the etching speed at light-sensed portions thereof is remarkably faster than that at non-light-sensed portions thereof. Accordingly, only the light-sensed portions can be selectively etched with the use of an etchant such as HF or the like. Thus, there can be obtained highly precise support stands by using a photolithography technique at the time of light exposure.

The following description will discuss a manufacturing method in accordance with another embodiment of the present invention, with reference to FIG. 4 (a) to (d).

As shown in FIG. 4 (a), a photosensitive glass plate 211 is exposed to light with the use of a mask to form light-sensed portions 212 at other portions of the glass plate 211 than the portions adapted to serve as detector support stands. Then, the glass plate 211 is covered at one surface thereof with wax 91 and the light-sensed portions 212 are etched by a predetermined depth, as shown in FIG. 4 (b).

As shown in FIG. 4 (c), pyroelectric elements 210 are placed on the glass plate 211. The wax 91 is first removed, and the remaining light-sensed portions 212 are then removed by etching, thus forming support stands 202 as shown in FIG. 4 (d). At this etching step, that side of the glass plate 211 on which the pyroelectric elements 210 are placed, may be protected with wax. Alternatively, the step (d) may be omitted.

Figure 6A:
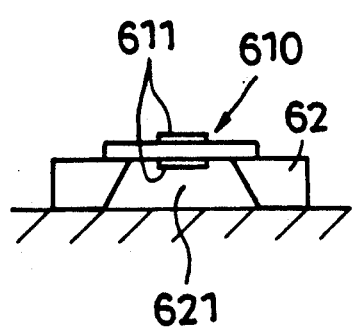
FIG. 6 (a) and (b) show conventional examples of a general structure of a support stand for a pyroelectric detector.
Figure 6B:
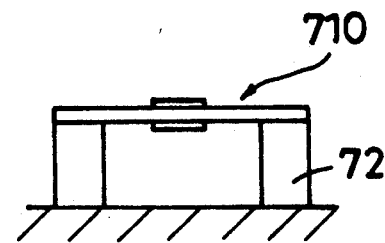

The embodiment above-mentioned still includes a step of placing the pyroelectric elements 210 on the glass plate 211. At this step, however, the respective support stands 202 are not separated from one another. Accordingly, the element placing step can be more easily conducted than conventionally done. Thus, the structure in FIG. 6 (a) mentioned earlier can also be realized.

According to the manufacturing method of this embodiment shown in FIG. 4, after the pyroelectric elements 210 are placed on the top of the glass plate 211 at the step (a), the light-sensed portions 212 may be removed so that a support stand having four legs is formed for each of the pyroelectric elements 210. In this case, a troublesome step of placing the pyroelectric elements 210 on the support stands may be eliminated.

In the embodiments above-mentioned, the description has been made on the application where the present invention is applied to a photodetector using a pyroelectric detector element. However, the present invention should not be limited to such an application, but may also be applied to other thermal photodetector using, for example, a thermopile or thermistor.

What is claimed is:

1. A thermal photodetector comprising:
   a thermal photodetector element;
   a support stand for supporting the thermal photodetector element;
   a mount for supporting the support stand in a thermally connecting state, the mount having a temperature controlled to a predetermined value; and
   the support stand being made of photosensitive glass and has a size determined such that the quantity of heat conduction in a heat conduction passage from the thermal photodetector element to the mount is equal to a predetermined quantity.

2. A thermal photodetector according to claim 1, wherein the thermal photodetector element is a pyroelectric element.

3. A thermal photodetector according to claim 2, wherein the pyroelectric element is an element using a pyroelectric crystal of a TGS (triglycine-sulphate) system.

4. A thermal photodetector according to claim 1, wherein the thermal photodetector element is a thermopile.

5. A thermal photodetector according to claim 1, wherein the thermal photodetector element is a thermistor.

6. A thermal photodetector according to claim 1, wherein the mount is a heat sink thermally connected to heating and cooling means.

7. A thermal photodetector according to claim 1, wherein the mount is a hybrid IC board on which a Peltier element is mounted.

8. A method of manufacturing a thermal photodetector comprising the steps of:
   exposing, to light, a photosensitive glass plate having a thickness corresponding to the height of a support stand of a thermal photodetector to be manufactured, said light exposure being made with the use of a mask having a light shield portion of which shape is corresponding to the shape in transverse section of said support stand;
   sticking, with adhesives, said photosensitive glass plate to a pyroelectric crystal plate provided on one surface thereof with an electrode for taking out a signal, said surface of said pyroelectric crystal plate on which said electrode is mounted facing said photosensitive glass plate;
   polishing the surface of said pyroelectric crystal plate opposite to the sticked surface thereof, thereby to reduce the thickness of said pyroelectric crystal plate; and
   removing, by etching, the light-sensed portion of said photosensitive glass plate which has been formed by said light exposure.

* * * * *